(12) United States Patent
Beaulaton et al.

(10) Patent No.: US 9,166,617 B1
(45) Date of Patent: Oct. 20, 2015

(54) COMMUNICATION UNIT, DIGITAL BAND-PASS SIGMA-DELTA MODULATOR AND METHOD THEREFOR

(71) Applicants: Hugues Beaulaton, Toulouse (FR); Jean-Christophe Nanan, Toulouse (FR)

(72) Inventors: Hugues Beaulaton, Toulouse (FR); Jean-Christophe Nanan, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/574,568

(22) Filed: Dec. 18, 2014

(30) Foreign Application Priority Data

Mar. 31, 2014 (WO) .................. PCT/IB2014/000803

(51) Int. Cl.
*H03M 3/00* (2006.01)
*H03K 7/08* (2006.01)
*H04L 27/20* (2006.01)
*H03G 3/30* (2006.01)

(52) U.S. Cl.
CPC .............. *H03M 3/404* (2013.01); *H03M 3/502* (2013.01); *H03M 3/51* (2013.01); *H03G 3/3042* (2013.01); *H03K 7/08* (2013.01); *H03M 3/30* (2013.01); *H04L 27/2092* (2013.01)

(58) Field of Classification Search
CPC ....... H03M 3/30; H03K 7/08; H04L 27/2092; H03G 3/3042
USPC ................. 341/143; 375/238, 308; 455/127.2
See application file for complete search history.

(56) References Cited

U.S. PATENT DOCUMENTS

2009/0238258 A1* 9/2009 Sjoland .......................... 375/238

FOREIGN PATENT DOCUMENTS

WO    WO2005120001 A2    12/2005

* cited by examiner

*Primary Examiner* — Joseph Lauture (57) ABSTRACT

A communication unit comprises a power DAC. The DAC comprises: a switched mode power amplifier (SMPA); and a digital band-pass sigma-delta modulator operably coupled to the SMPA. The sigma-delta modulator comprises an input to receive an input baseband signal; a delay; an adder module arranged to add a feedback signal with an output from the delay; and at least two feedback branches. The sigma-delta modulator is arranged to digitally oversample the input baseband signal such that a ratio of a sampling frequency employed by the sigma-delta modulator to a radio frequency (RF) output from the DAC is fixed and the sampling frequency tuned or wherein the sampling frequency is fixed and the ratio is adjusted, such that a first feedback branch in the sigma-delta modulator is formed using at least one from a group of: a zero gain, an additive inverse of a second feedback branch.

17 Claims, 7 Drawing Sheets

$\omega = f_s/2 = \pi$

COMMUNICATION UNIT, DIGITAL BAND-PASS SIGMA-DELTA MODULATOR AND METHOD THEREFOR

CROSS REFERENCE TO RELATED APPLICATION(S)

The present application claims priority to International Patent Application No. PCT/IB2014/000803, entitled "COMMUNICATION UNIT, DIGITAL BAND-PASS SIGMA-DELTA MODULATOR AND METHOD THEREFOR," filed on Mar. 31, 2014, the entirety of which is herein incorporated by reference.

FIELD OF THE INVENTION

This invention relates to a method and apparatus for signal encoding for switch mode radio frequency (RF) power amplifiers, and in particular to class 'D' switch mode RF power amplifiers.

BACKGROUND OF THE INVENTION

Until recently, laterally diffused Metal-Oxide-Semiconductors (LDMOS) were the preferred technology for amplifying large powers up to around 3 GHz, generally in a quasi-linear operating mode (class AB). LDMOS is typically used due to satisfactory cost/performance trade-offs.

However, these types of devices suffer from efficiency issues, and are not compatible with very fast switching signals, due to a limited transition frequency.

Recently, technological improvements within the semiconductor industry have resulted in increased use of switched mode power amplifiers with increased functionality, allowing them to operate at high power and switching frequencies for use with cellular telecommunications.

Figure 1:
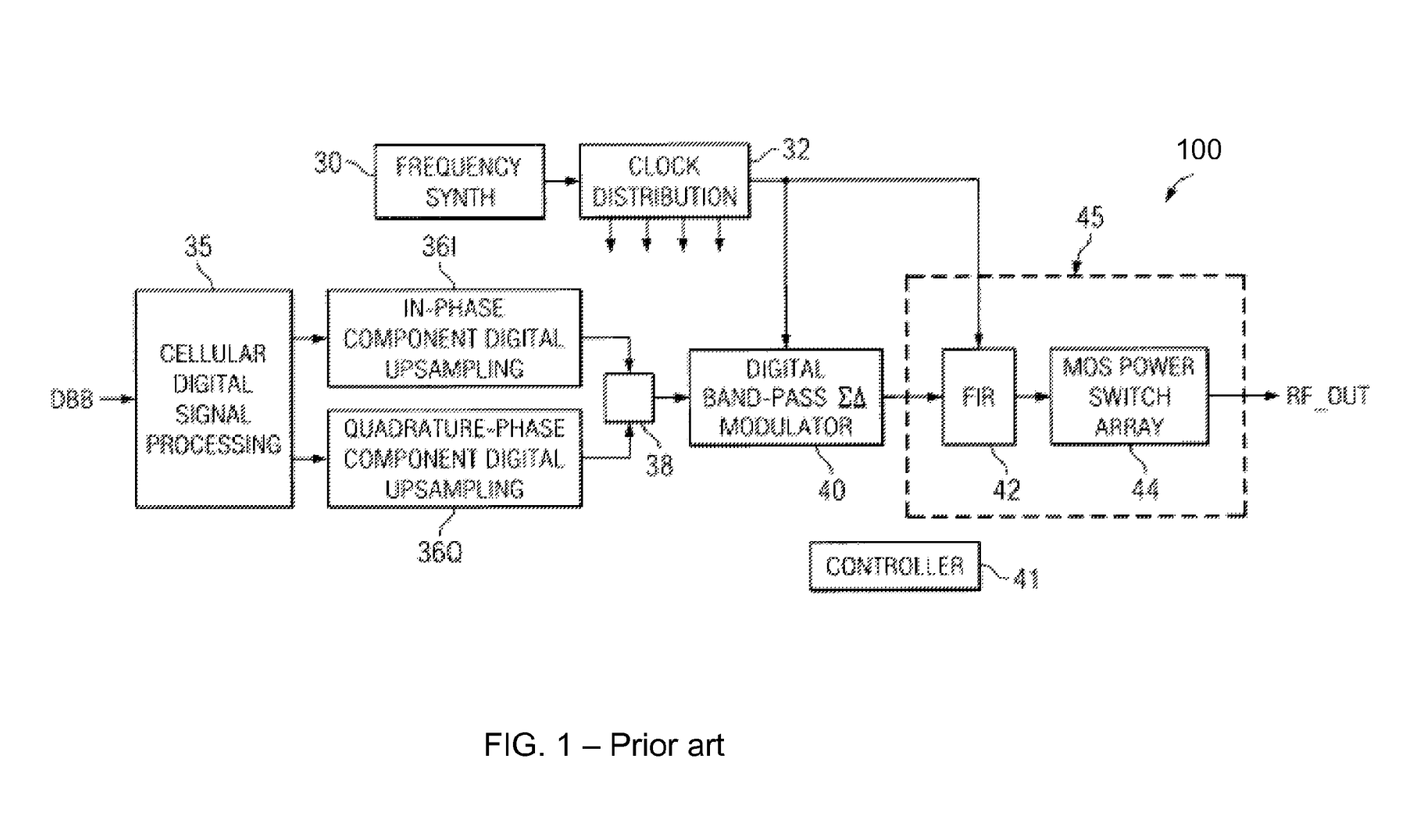
FIG. 1 schematically shows an example of a known transmitter block diagram that uses a digital band-pass sigma-delta modulator to drive an array of MOS switches.

Referring to FIG. 1, a known transmitter 100, as illustrated in WO2005120001, utilises a digital band-pass sigma—delta ($\Sigma\Delta$) modulator 40 to up-convert the baseband signal to an intermediate frequency, apply a digital finite impulse response filter, and drive an array of MOS switches. Digital baseband (DBB) input signals are received by a cellular digital signal processing function 35, which performs serial-to-parallel conversion, digital filtering, splitting of the signals into in-phase and quadrature-phase components and sample rate conversion. The in-phase component of the signal is forwarded to in-phase digital up-converter function 36I, and the quadrature-phase component of the signal is forwarded to quadrature-phase up-converter function 36Q. The outputs of in-phase and quadrature-phase digital up-converter functions 36I, 36Q are applied to inputs of adder 38, which combines the up-converted components and applies the result to digital band-pass sigma-delta modulator 40. The modulated output signals from digital band-pass sigma-delta modulator 40 are filtered by finite impulse response (FIR) digital filter 42, and are the input signals applied to MOS power switch array 44.

Digital band-pass sigma-delta modulator 40 converts the relatively wide input data into a fewer number of bits per sample, having a frequency spectrum that is centred at a desired transmit frequency. Further, digital band-pass sigma-delta modulator 40 is constructed to have notches, or 'zeroes', on either side of the desired transmit frequency, with at least one of the notches corresponding to the centre of the receive band.

Class D power amplifiers, in theory, can achieve very high power efficiencies, due in part to these types of amplifiers utilising a square wave, resulting in a unity peak-to-average power ratio (PAPR). However, generally, these types of power amplifiers have typically been used to amplify baseband signals, for example as used in audio amplifiers. The application of switched mode (e.g. Class D') amplifiers for cellular communications, such as orthogonal frequency division multiplex (OFDM) and wideband code division multiple access (WCDMA) communication systems, has been problematic, not least because the signals to be amplified are at the desired radio frequency (RF). Furthermore, the data rates to be supported approach the channel capacity and the modulations employed to achieve such performances typically require a large crest factor (namely the ratio between the peak-power at a given occurrence and the root mean square (RMS) power). Even with a help of an efficient crest factor reduction algorithm, the typically modulation schemes require significant back-off of the power amplifier from the optimum operating point, which greatly reduces the efficiency and level of average power transmitted.

The switch mode power amplifier may, in theory, achieve very high power efficiencies, since the input signal is a square wave with an unity peak to average power ratio (PAPR). Thus, no back-off of the power amplifier from the optimum operating point is required. However, for cellular operation at the desired RF frequency, these types of class D power amplifiers can suffer from very high sampling frequencies and lower output efficiencies when utilised for RF power amplification. As such, their use has, thus far, been limited.

SUMMARY OF THE INVENTION

The present invention provides a communication unit, a band-pass sigma-delta modulator and a method therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the present invention provide a power digital to analog converter based on a second or fourth order band-pass sigma-delta architecture that is suitable for use with a multi-states quantizer. Use of such a power digital to analog converter as herein described may improve the overall efficiency of the band-pass modulated switch mode power amplifier.

Examples of the present invention provide a baseband signal to be frequency shifted and amplified as an input to a second or a fourth order band-pass sigma-delta architecture. Examples of the present invention propose a second or fourth order band-pass sigma-delta architecture with one or two pairs of complex zeroes respectively. Examples of the present invention also provide a multi-level quantizer, for example a 7-state quantizer has been determined as a good trade-off between complexity and performance. Examples of the present invention also provide a mechanism to set a sampling frequency of the second or fourth order band-pass sigma-delta architecture as being between twice and eight times the RF frequency of the power digital to analog converter/communication unit.

Figure 2:
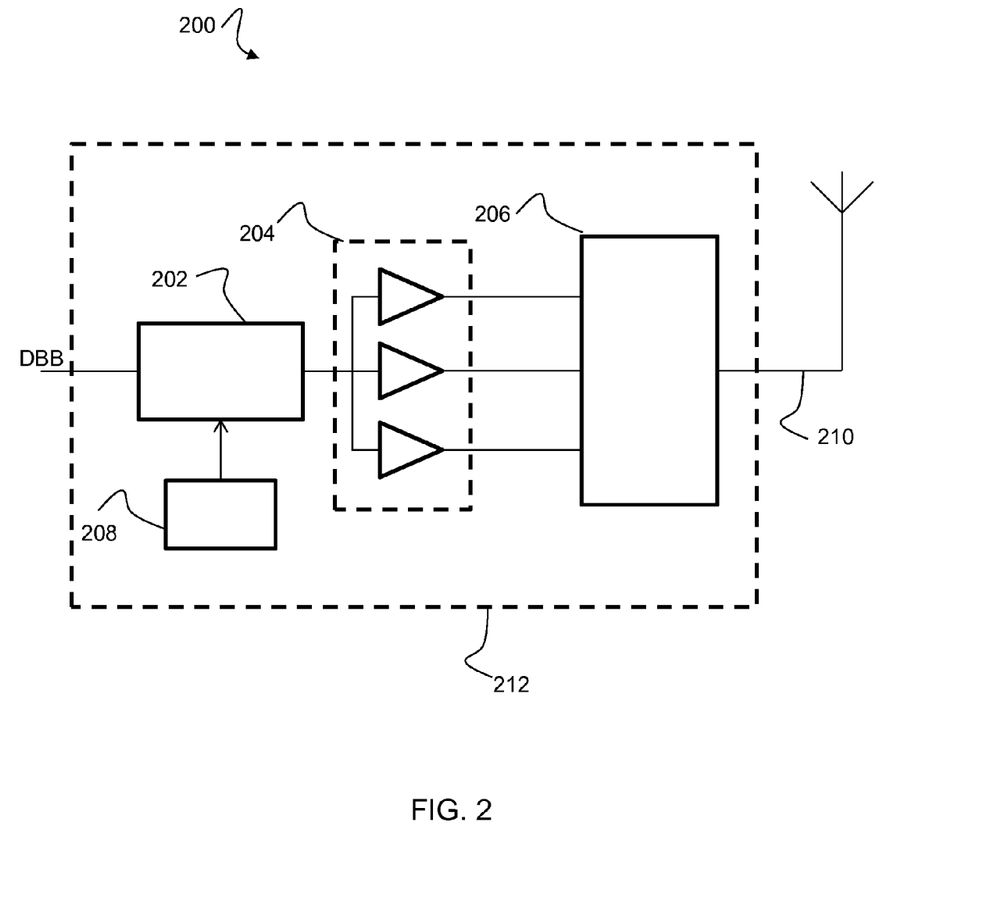
FIG. 2 illustrates a simplified example transmitter comprising a switched mode power amplifier system.

Referring to FIG. 2, an example of a simplified transmitter 200, for example as part of a wireless communication unit (such as a RF base-station), is illustrated. The simplified transmitter 200 comprises, a power digital to analog converter comprising a band-pass sigma-delta modulator 202 coupled to a frequency synthesizer 208, such as a phased locked loop (PLL) and an array of power transistors 204, which in turn is coupled to a combiner and reconstruction filter 206, and thereafter to an antenna 210.

Sigma-delta modulators are often used in digital to analog converters (DACs). In general, a DAC converts a digital number representing an analog value into that analog value. For example, an analog voltage level may be represented as a 20 bit digital number, and the DAC converts that number into the desired voltage. To actually drive a load (such as an audio speaker) a DAC is usually connected to or integrated with an electronic amplifier such as a Class 'D' Amplifier. In this case, a multi-bit digital number is input to the sigma-delta modulator, which converts it into a faster sequence of 0's and 1's. These 0's and 1's are then converted into analog voltages. The conversion, usually with MOSFET drivers, is typically very efficient in terms of power, as the drivers are usually either fully 'on' or fully 'off', and in these states have low power loss.

The resulting two-level signal now represents the desired signal, but with higher frequency components in order to change the signal so that it only has two levels. These added frequency components arise from a quantization error of the sigma-delta modulator, but can be filtered away by a simple low-pass filter. The result is a reproduction of the original, desired analog signal from the digital values. The use of a sigma-delta modulator in digital to analog conversion of signals has enabled a cost-effective, low power, and high performance solution.

In some examples, some or all of the above mentioned components may be located within an integrated circuit (IC) 212, as shown, thereby forming a switched mode power amplifier system.

The RF frequencies for RF base-stations are typically around 900 MHz, 1800 MHz and more than 2 GHz. Since the modulator used in such communication units is required to oversample the RF signal, it has to run very fast. This is achieved in herein described examples by implementing complex conjugate pair of zeroes. The implementing of complex conjugate pair of zeroes often implies a use of multipliers to provide the correct transfer function. However, the inventors have determined that when the sampling frequency of the sigma-delta modulator is between two times and eight times (and, in some particular herein described examples, three or four times the output RF frequency), the 'gain' applied to the feedback branches, for $2^{nd}$ or $4^{th}$ order band-pass sigma-delta modulators may be very easy to implement. For example, in a scenario where the sampling frequency of the sigma-delta modulator has such a relationship with the output RF frequency, it is possible to implement gain to the feedback branches for either a second order or fourth order band-pass sigma-delta modulator as either no gain or using just an inverter. Advantageously, this feature enables a much higher operating frequency to be supported.

In this example, the array of power transistors 204 may form part of a switch mode power amplifier, operable with band-pass second or fourth order sigma-delta modulator 202. In some examples, the switch mode power amplifier may be a Class D' power amplifier.

Initially, the band-pass second or fourth order sigma-delta modulator 202 may receive one or more digital baseband signal(s), and digitally over-sample the received input baseband signals. In some examples, the band-pass second or fourth order sigma-delta modulator 202 may operate at around three or four times the operating RF frequency. In some examples, four times the operating RF frequency provides a symmetric spectrum at the expense of a faster switching than three times the RF frequency.

The frequency synthesizer 208 is operable to set the sampling frequency of the band-pass second or fourth order sigma-delta modulator 202 as well as set a final frequency of the transmit signal to be radiated from the antenna 210.

Output signals from the band-pass second or fourth order sigma-delta modulator 202 are received and individually amplified by amplifiers in the array of power transistors 204, wherein the output signals may be weighted according to a quantizer transfer function that may form part of the second or fourth order sigma-delta modulator 202.

Subsequently, the array of power transistors 204 output high frequency high power signals to the combiner and reconstruction filter 206, before a combined resultant RF modulated signal is radiated from antenna 210.

Figure 3:
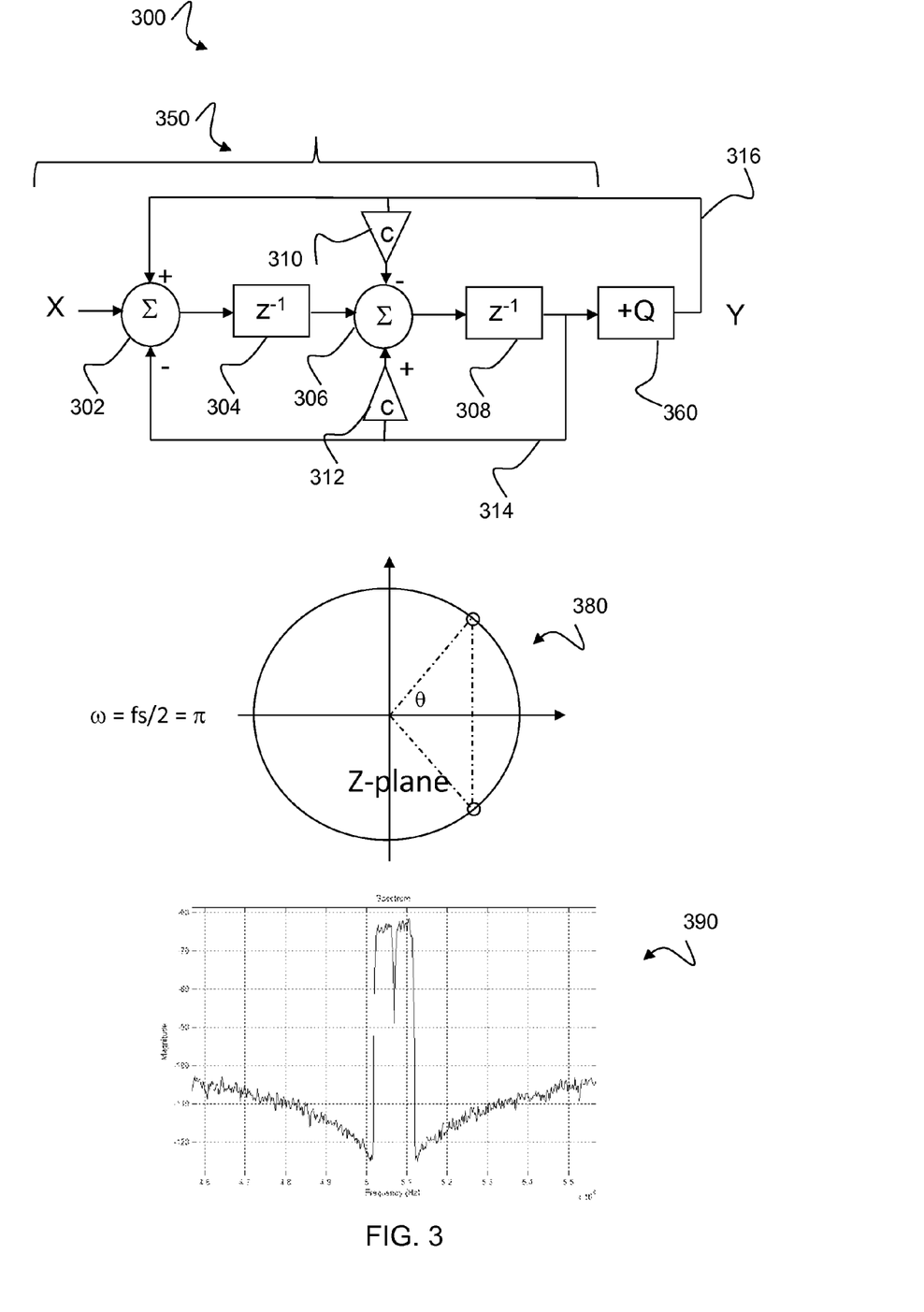
FIG. 3 illustrates an example implementation of a second order band-pass sigma-delta architecture.

Referring to FIG. 3, an example of a band-pass second order sigma-delta modulator 300, for example the band-pass second order sigma-delta modulator 202 from FIG. 2 is illustrated. The band-pass second order sigma-delta modulator 300 comprises band-pass sigma-delta architecture 350 and a quantizer 360.

In this example, the band-pass sigma-delta architecture 350 forms a second order modulator, comprising a first adder module 302 (e.g. adding input 'X' (as illustrated) and a digitally modulated signal via feedback branch 316, and subtracting therefrom a digitally modulated signal via feedback branch 314), a first delay 304, second adder module 306 (adding the delayed output from first delay 304 and a gain-adjusted digitally modulated signal via feedback branch 314, and subtracting therefrom a gain-adjusted digitally modulated output signal via feedback branch 316), second delay 308, and first and second gain coefficients 310, 312.

In this example, delays 304, 308 may be produced by integrator modules, and adder modules 302, 306 may comprise difference blocks/functions, e.g. subtractor modules.

Further, in this example, gain coefficients 310, 312 may be implemented as gain stages, operable to impart a gain onto signals routed via feedback branches 316, 314 of the band-pass second order sigma-delta modulator 300, where the gain coefficient 310 is the opposite polarity of gain coefficient 312 and where the feedback branch 314 is applied to adder 302 in the opposite polarity of feedback branch 316. The feedback, gain-adjusted signals are either added to, or subtracted from, signals routed through the main signal path at second adder module 306, in a typical second order sigma-delta modulator manner.

In this example, however, the band-pass second order sigma-delta architecture 350 receives a baseband signal 'X', and modulates the signal directly at the desired RF frequency. In some examples, the band-pass second order sigma-delta architecture 350 oversamples the baseband signal 'X' by, say, three or four times the desired RF frequency. In some examples, this may reduce quantization noise within the signal band by spreading a fixed quantization noise power over a bandwidth that may be much larger than the signal band.

In this example, the baseband signal 'X' is passed through the band-pass second order sigma-delta architecture 350, wherein an output sample on feedback branch 314 located before the quantizer 360, is fed back to adder module 302 and subtracted from baseband signal 'X'. Further, an output 'Y' 316, notably located after the quantizer 360, is also fed back to adder 302 and added to baseband signal 'X' and the sample fed back on the feedback branch 304. The resultant combined signal output from first adder module 302 is input to and delayed by the first delay 304. The delayed signal is then output, modified based on gain coefficients 310, 312, before being input to second delay 308. In some examples, coefficients 310, 312 may apply gain values to the feedback branches 314 and 316.

In some examples, the sampling frequency of the band-pass second order sigma-delta architecture 350 is arranged to be around three to four times the desired RF frequency, i.e. oversampled, the gain applied to feedback branches 314, 316 may be easier to implement when compared to other sampling frequencies. For example, very little gain may need to be applied to feedback branches 314, 316 and, in some examples, no gain may need to be applied at all. Furthermore, gain coefficients 310, 312 may be implemented as just an additive inverse (or opposite polarity gain) of the second feedback branch gain co-efficient, as it is known in the technical field.

Therefore, utilising a sampling frequency, which may be, for example, three to four times the output RF may allow for a higher operating RF at the output.

In this example, the gain coefficients 'C' 310, 312 may be represented by the following equation in Eq. [1]:

$$c = 2\cos\theta = 2\cos\left(2\pi \frac{f_{notch}}{f_{sd}}\right) \quad [1]$$

Where: $\theta$ refers to the position of a pair of complex zeroes on the Z-plane 380, as shown.

Thus, as shown in equation [1]:

if fsd=4*fnotch (i.e. the sampling frequency ($f_{sd}$) of the band-pass second order sigma-delta architecture 350 is set to be four times the desired RF frequency ($f_{notch}$)), c=2 cos(2 pi/4)=0; hence, gain coefficients 'C' 310, 312 are advantageously removed; and if fsd=3*fnotch (i.e. the sampling frequency ($f_{sd}$) of the band-pass second order sigma-delta architecture 350 is set to be three times the desired RF frequency ($f_{notch}$)), c=2 cos(2 pi/3)=−1; hence, the 'minus' and 'plus' signs in the adders 302, 306 of the band-pass second order sigma-delta architecture 350 must be swapped and the gain coefficients 'C' 310, 312 advantageously removed (thereby providing unity gain).

Therefore, gain coefficients 310, 312 may relate to simple additive inverse modules, which are operable to provide no gain adjustment to signals routed from feedback branches 314, 316 to respective inputs of the second adder module 306.

In this example, the position of the complex zero pair determines the frequency of the resultant RF signal, wherein the transfer function for the sigma-delta architecture 350 and quantizer 360 is illustrated in Eq. [2].

$$Y = Xz^{-2} + Yz^{-2} - Ycz^{-1} - (Y - Q)z^{-2} + (Y - Q)cz^{-1} + Q \quad [2]$$

$$Y = Xz^{-2} + Q(z^{-2} - cz^{-1} + 1)$$

$$\cos\theta = \frac{e^{j\theta} + e^{-j\theta}}{2} \rightarrow \text{Euler}$$

$$Y = Xz^{-2} + Q(z^{-1} - e^{j\theta})(z^{-1} - e^{-j\theta})$$

Thus, in examples where the sampling frequency ($f_{sd}$) of the band-pass second order sigma-delta architecture 350 is set to be around four times the desired RF frequency ($f_{notch}$), as shown in the spectral plot 390, then Eq. 1 will reduce to C=0. Spectral plot 390 illustrates a spectrum of two WCDMA signals using a band-pass second order sigma-delta architecture 350 prior to reconstruction, with a 7-state quantizer (using equal step size, see FIG. 5) and four times oversampling. In this example, therefore, gain coefficients 310, 312 may not be required to provide gain to feedback branches 310, 312 before being input to adder module 306. As a result, gain coefficients 310, 312 may be implemented as unity gain devices, for example, or, in some example implementations, not be required at all.

Thus, an advantage of utilising sampling frequencies of substantially around three or four times the required output RF, may be that simpler gain coefficient 310, 312 values are required, thereby allowing a faster modulator to be implemented.

In some examples, a desired output frequency may be arranged to locate one notch ($f_{notch}$) at the desired output frequency, in order to improve adjacent channel level ratio (ACLR).

Further, in this example, setting gain coefficients 310, 312 to '0' or '−1', may greatly simplify the architecture of band-pass second order sigma-delta architecture 350 and quantizer 360, as well as increase the speed of the modulator.

In some further examples, if the transmitted RF frequency requires changing, it is easier to change the sampling frequency of the band-pass sigma-delta modulator in order to maintain a particular ratio between the modulator sampling frequency and the output RF frequency, rather than tuning gain coefficients, in order to change a location of at least one complex pair of zeroes. In some examples, either the ratio is fixed and the frequency is tuned, or the frequency is fixed and the ratio is adjusted. Thus, in this manner, it may be beneficial to tune a frequency synthesizer 208, for example PLL from FIG. 2, in order to set the sampling frequency of the modulator and, therefore, the location of the desired notch frequency of the output RF signal, rather than to tune gain coefficients 310, 312, per se. In some examples, this may have an advantage of maintaining a ratio of three or four times of $f_{sd}$ compared to $f_{notch}$, and, therefore, maintaining the position of the complex pair of zeroes in the same, or similar, location.

Therefore, maintaining a ratio between the sampling frequency and output RF frequency of 3:1 or 4:1, may provide a simpler band-pass sigma-delta modulator 300 to be implemented, that requires only an additive inverse or a simplified gain such as an unity gain.

Figure 4:
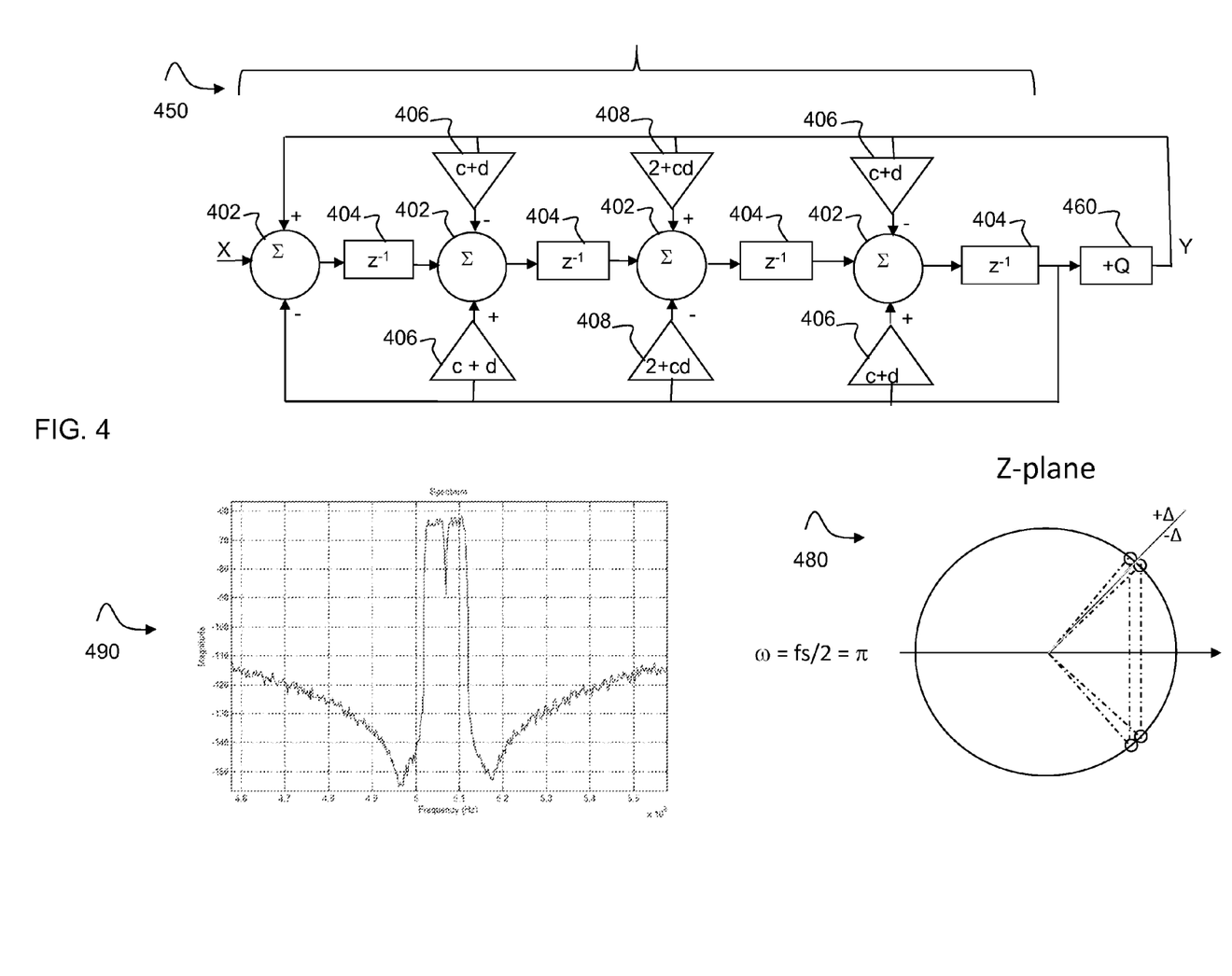
FIG. 4 illustrates an example implementation of a fourth order band-pass sigma-delta architecture.

Referring to FIG. 4, a further example of a band-pass fourth order sigma-delta modulator 400, for example as could be implemented as the band-pass sigma-delta modulator 202 from FIG. 2, is illustrated. The band-pass fourth order sigma-delta modulator 400 comprises band-pass sigma-delta architecture 450 and a quantizer 460.

In this example, the band-pass sigma-delta architecture 450 forms a fourth order modulator, comprising a number of adder modules 402, a number of delays 404, a number of gain coefficients (c+d) 406, and a number of gain coefficients (2+cd) 408.

The band-pass sigma-delta architecture 450, may improve signal to noise ratio (SNR) and adjacent channel level ratio (ACLR), when compared to a second order device, for example the band-pass sigma-delta architecture 350 in FIG. 3. However, the band-pass sigma-delta architecture 350 of FIG. 3 may provide a higher efficiency compared to band-pass sigma-delta architecture 450 of FIG. 4, as more energy is generated out-of-band and then filtered, thereby decreasing the efficiency of high order sigma-delta modulators.

Much of the operation of band-pass sigma-delta architecture 450 is similar to the operation of band-pass sigma-delta architecture 350 in FIG. 3, other than that the number of delays 404 and adder modules 402 has increased and the gain coefficient values are different.

Further, in this example, there are two complex pairs of zeroes, namely complex zero pair 'c' and complex zero pair 'd'. Example locations for complex zero pair 'c' and complex zero pair 'd' is illustrated by 480.

Referring to this example, complex zero pair 'c' is defined by Eq. 3, and complex zero pair 'd' is defined by Eq. 4.

$$c = 2\cos\left(2\pi \frac{f_{notch} + \Delta}{f_{sd}}\right) \text{(noting delta is at numerator level)} \quad [3]$$

$$d = 2\cos\left(2\pi \frac{f_{notch} - \Delta}{f_{sd}}\right) \text{(noting delta is at numerator level)} \quad [4]$$

where: the delta value is the frequency difference between the desired frequency of the RF signal and the location of the notches.

In this example implementation, the notches are placed around a 'middle frequency', where the modulated RF spectrum will stand (in the middle of the notches). In other words, the locations of the notches are 'fmiddle+delta' and 'fmiddle−delta'.

In some examples, if the sampling frequency ($f_{sd}$) of the band-pass sigma-delta architecture 450 is set to be around four times that of the desired RF frequency ($f_{notch}$) as shown in the spectral plot 490, gain coefficient 'c' may simplify to $1-\Delta$, and gain coefficient 'd' may simplify to $1+\Delta$. As a result, gain coefficient (c+d) 406 may simplify to $-2-2\Delta$, and gain coefficient (2+cd) 408 may simplify to $2+(1-\Delta^2)$. Spectral plot 490 again illustrates a spectrum of two WCDMA signals using a band-pass second order sigma-delta architecture 350 prior to reconstruction, with a 7-state quantizer (using equal step size, see FIG. 5) and four times oversampling. In some examples, this may simplify the implementation of band-pass sigma-delta architecture 450 compared to utilising other sampling frequencies, as the gain required by gain coefficients 406, 408 may be simplified In some other examples, $f_{sd}$ of the band-pass sigma-delta architecture 450 may be set to around four times that of the desired RF frequency ($f_{notch}$). As a result, gain coefficient 'c' may simplify to '$-\Delta$', and gain coefficient 'd' may simplify to '$\Delta$'. Therefore, gain coefficient 'c+d' 406 may simplify to zero, and gain coefficient '2+cd' 408 may simplify to '$-\Delta^2$'. In this example, and referring to the sampling frequency $f_{sd}$ being $4*f_{notch}$, the implementation of the band-pass sigma-delta architecture 450 may be easier than that of the band-pass sigma-delta architecture 450 utilising a sampling frequency of $3*f_{notch}$.

In some examples, utilising a sampling frequency $f_{sd}$ that is either equal, or close, to $3*f_{notch}$ or $4*f_{notch}$, may result in the gain required to be implemented by gain coefficients 'c' and 'd' in order to operate the band-pass sigma-delta architectures 350, 450 are significantly easier to implement that utilising other sampling frequencies.

As discussed previously in relation to FIG. 3, it may be advantageous to also not tune the 'c' and 'd' gain coefficients in FIG. 4, if the desired RF frequency is to be changed. It may be beneficial to change the operating frequency of the band-pass sigma-delta architecture 450, utilising a frequency synthesizer, such as a PLL for example, in order to maintain either a three or four times increase in $f_{sd}$ when compared to $f_{notch}$, rather than change the position of the complex zero pairs via the 'c' and 'd' gain coefficients.

Figure 5:
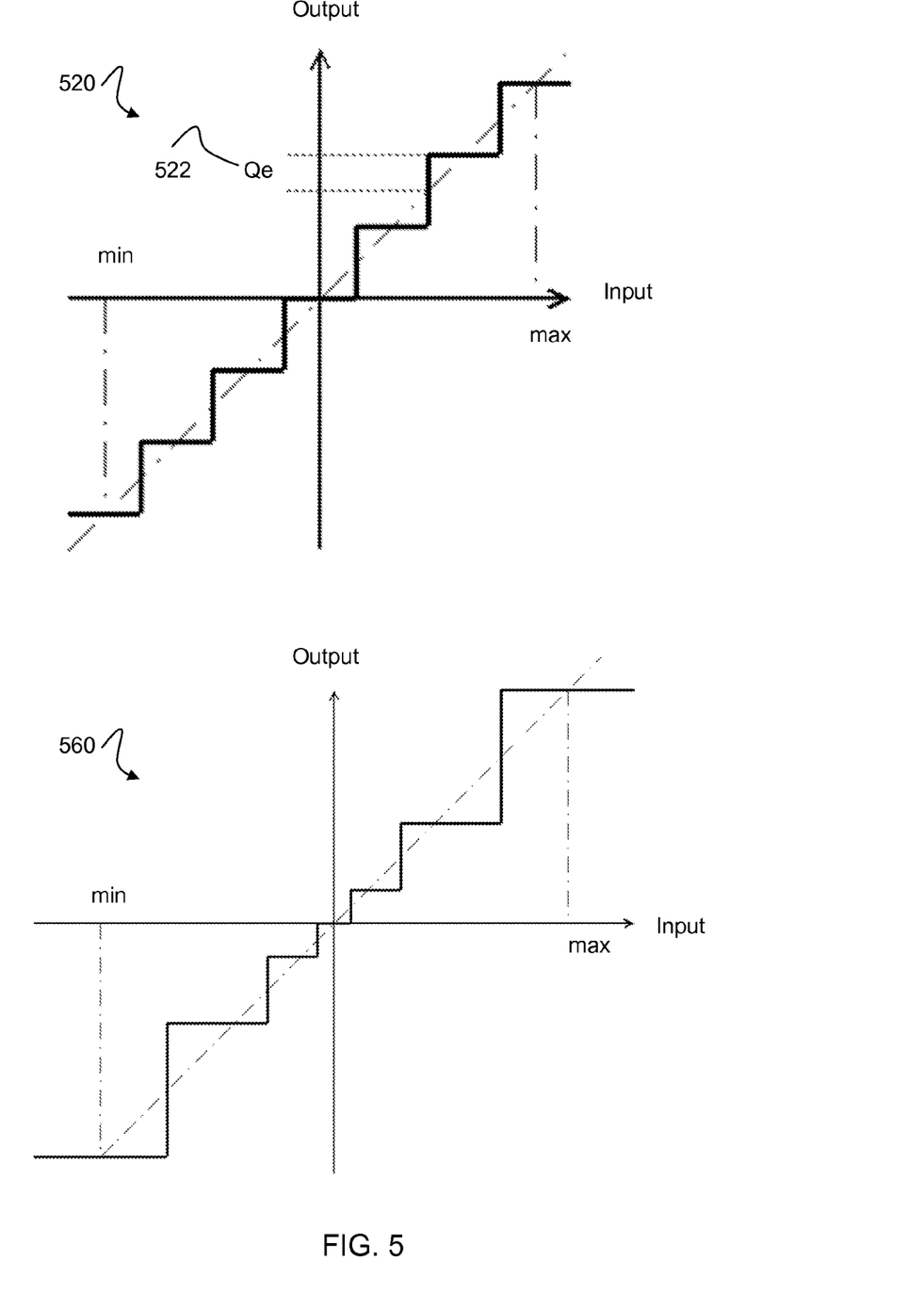
FIG. 5 illustrates an example of a multi-level quantizer operation.

Referring to FIG. 5, examples of a fixed-step multi-level quantizer operation 520 and an an example of a variable-step multi-level quantizer operation 560, for example as could be used as quantizer 360 in FIG. 3 or quantizer 460 in FIG. 4, are illustrated. The multi-level quantizer models the amplifier and combiner transfer function, and may increase the level of quantization thereby reducing the quantization error (Qe) and therefore the energy outside the desired bandwidth. In some examples, this may lead to better efficiency of switch mode power amplifiers, for example switch mode power amplifiers utilising band-pass sigma-delta architectures as herein described.

Referring to fixed-step multi-level quantizer operation 520, the step sizes for each quantization level are uniform, thereby leading to, in this example, a uniform quantization error Qe 522. Further, as all the states of fixed-step multi-level quantizer operation 520 are equally spaced, the higher steps tend not to be utilised.

Thus, in some examples, it may be advantageous to utilise a variable-step multi-level quantizer that has a non-uniform step size, for example as illustrated with reference to quantizer operation 560. In some examples, a non-uniform step size in the most often used regions of the quantizer may improve the occurrence of each level. Here, as the higher levels of quantization are not often used in comparison with the lower quantization levels, it may be possible to mitigate heating and therefore behavioural changes in the quantizer transfer function when there is a power transistor per quantizer level (e.g. distribute the signal occurrence across a larger number of power transistors). Thus, for example, it may be possible to facilitate cooling of a band-pass power switch modulator, for example band-pass power switch modulator 202 by employing a non-uniform step size facilitating cooling of switches, for example the array of power transistors 204 in FIG. 2.

In some examples, the states of the quantizer operation 560 may be placed closer at lower level and further away as the quantizer state levels rise. This may allow for an improved distribution of active switches, which may allow for improved cooling of the active switches, array of power transistors 204, and therefore the band-pass power switch modulator, thereby improving efficiency.

In some examples, increasing the number of quantization levels/states may increase the SNR, but may also increase complexity of the band-pass power switch modulator.

In some other examples, a seven state/level quantizer may provide a good trade-off between SNR performance and complexity.

Further, in some examples, utilising a quantizer with a varying step size may increase efficiency of the band-pass power switch modulator.

In addition, in some examples, the aforementioned communication unit may employ a ratio of a sampling frequency employed by the digital band-pass sigma-delta modulator to a radio frequency (RF) output from the power digital to analog converter by fixing the ratio and tuning the frequency, or where the frequency is fixed and the ratio is adjusted.

Figure 6:
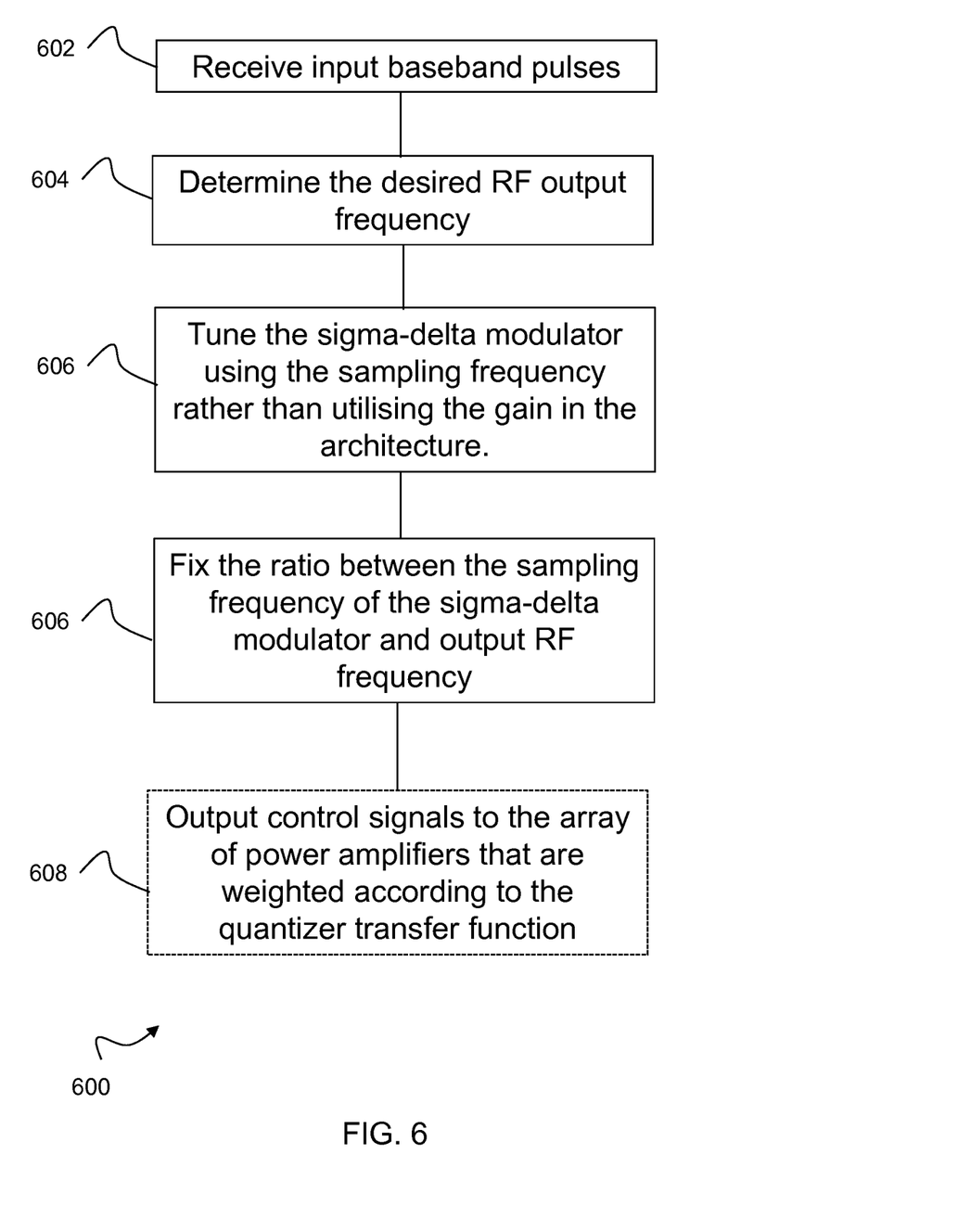
FIG. 6 illustrates an example flow chart for a band-pass sigma-delta architecture.

Referring to FIG. 6, a flow chart 600 of an operation of a band-pass sigma-delta modulator, for example the band-pass sigma-delta modulator shown in FIGS. 3 and 4, is illustrated. Initially, at 602, the band-pass sigma-delta modulator receives a series of baseband (digitally modulated) signals. At 604, the desired output RF notch frequency ($f_{notch}$) is determined, which may, for example, be user defined, or defined by the band-pass sigma-delta modulator. At 606, the band-pass sigma-delta modulator may be tuned, via a frequency synthesizer, such as a PLL for example, to set the sampling frequency and, therefore, the location of the desired RF output signal. In some examples, modifying the sampling frequency may be preferable to modifying positions of 'c' (and in fourth order sigma-delta modulators, 'd') gain coefficients of the band-pass sigma-delta modulator.

At 608, the band-pass sigma-delta modulator may fix/maintain the ratio between the sampling frequency $f_{sd}$ and the desired RF output signal (e.g. a notch frequency ($f_{notch}$)). In some examples, the ratio between $f_{sd}$ and $f_{notch}$ may be set to be 3:1 or 4:1. In other examples, the ratio between $f_{sd}$ and $f_{notch}$ may be located somewhere between two and eight times the desired output RF signal frequency.

In some other examples, the ratio may be dynamically changed in order to maintain a desired ratio between $f_{sd}$ and $f_{notch}$, or to vary the ratio between two and eight times the desired output RF signal frequency.

In some examples, by only changing the sampling frequency of the band-pass sigma-delta modulator, rather than modifying 'c' and 'd' gain coefficients, the ratio between $f_{sd}$ and $f_{notch}$ may be maintained. Therefore, the location of complex zero pairs may be maintained, thereby allowing for a simpler implementation for gain values for the band-pass sigma-delta modulator.

At 608, the band-pass sigma-delta modulator may optionally output signals to an array of power amplifiers, wherein the array of power amplifiers may be weighted according to a quantizer transfer function. In some examples the quantizer transfer function may employ a uniform or non-uniform step size.

Figure 7:
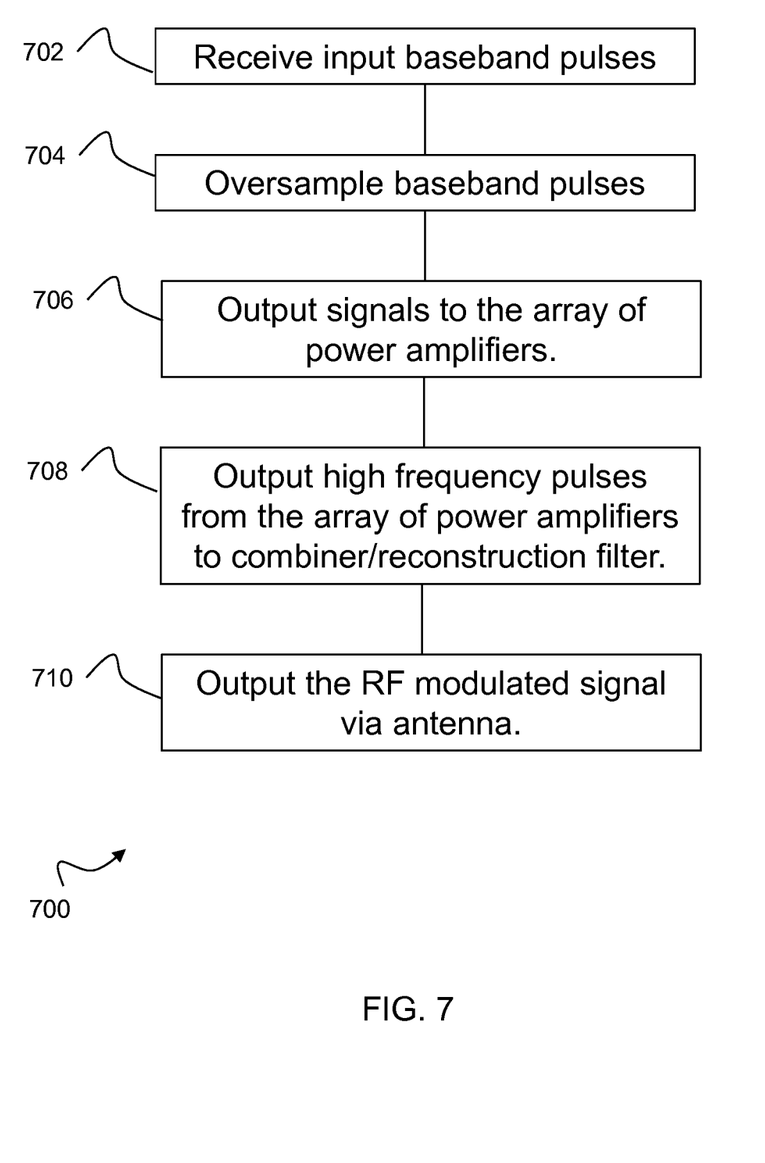
FIG. 7 illustrates an example flow chart for a switched mode power amplifier.

Referring to FIG. 7, a flow chart 700 of an operation of a switched mode power amplifier, incorporating some aspects of the invention is illustrated. As known to those skilled in the art, the operations of such a switched mode power amplifier employing a band-pass sigma-delta modulator and a quantizer substantially operate in parallel, as the signals are routed through (and fed back within) the band-pass sigma-delta modulator and quantizer.

Initially at 702, the switched mode power amplifier receives input baseband (digitally modulated) signals. At 704, the switched mode power amplifier may oversample the baseband signals. In some examples, the switched mode power amplifier may oversample the baseband signals by three or four times the desired RF output signal frequency. In some other examples, the switch mode power amplifier may oversample the baseband signals by between two and eight times the desired RF output signal frequency.

Therefore, in some examples, a sigma-delta mode power amplifier may be operable to convert baseband signals into a modulated stream of digital signals.

At 706, the switched mode power amplifier may output signals to an array of power amplifiers. In some examples, the output signals may be a modulated stream of digital pulses, which may optionally be weighted according to a relevant quantizer transfer function. Therefore, in some examples, the switched mode power amplifier may optionally be optimised according to efficiency based on set quantizer levels.

At 708, the switched mode power amplifier may output high frequency (digitally modulated) signals from the array of power amplifiers, which are them input to a combiner/reconstruction filter, before outputting the desired RF output signal via an antenna at 710.

In some examples, utilising a band-pass sigma-delta modulator within a switched mode power amplifier may increase the efficiency of the switched mode power amplifier. Further, in some examples, the use of a band-pass sigma-delta modulator as herein described may convert baseband signals to a digitally modulated stream of digital pulses provided to the array of power transistors, thereby negating a requirement to have some components in the transmitter path, which may comprise variable gain amplifiers (VGAs), mixers, etc.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A communication unit comprising a power digital to analog converter comprising:
   a switched mode power amplifier;
   a digital band-pass sigma-delta modulator operably coupled to the switched mode power amplifier and comprising:
      an input to receive an input baseband signal;
      at least one delay;
      at least two feedback branches; and
      at least one adder module arranged to add at least one feedback signal with an output from the at least one delay,
   wherein the digital band-pass sigma-delta modulator is arranged to digitally oversample the input baseband signal such that a ratio of a sampling frequency employed by the digital band-pass sigma-delta modulator to a radio frequency (RF) output from the power digital to analog converter is fixed and the sampling frequency is tuned or wherein the sampling frequency is fixed and the ratio is adjusted, such that at least one first feedback branch in the digital band-pass sigma-delta modulator is formed using at least one from a group of: a zero gain, an additive inverse of a second feedback branch.

2. The communication unit of claim 1 further comprising a frequency synthesizer providing a sampling frequency to the digital band-pass sigma-delta modulator wherein the radio frequency (RF) output from the power digital to analog converter is fixed by the frequency synthesizer tuning a sampling frequency employed in the digital band-pass sigma-delta modulator.

3. The communication unit of claim 2 wherein the sampling frequency, $f_{sd}$, is arranged to be one of: three times the RF output frequency from the power digital to analog converter, four times the RF output frequency from the power digital to analog converter.

4. The communication unit of claim 2 wherein the radio frequency (RF) output from the power digital to analog converter is set by tuning at least one complex pair of zeroes of the sampling frequency employed in the digital band-pass sigma-delta modulator.

5. The communication unit of claim 2 wherein the digital band-pass sigma-delta modulator is a second order digital band-pass sigma-delta modulator.

6. The communication unit of claim 5 wherein the frequency synthesizer is tuned to adjust the a complex pair of zeroes of the sampling frequency employed in the digital band-pass sigma-delta modulator and thereby tune a notch frequency of the RF output from the power digital to analog converter based on an adjacent channel level ratio.

7. The communication unit of claim 6, wherein a first pair of gain coefficients 'c' employed in the second order digital band-pass sigma-delta modulator is defined by:

$$c = 2\cos\theta = 2\cos\left(2\pi\frac{f_{notch}}{f_{sd}}\right).$$

8. The communication unit of claim 1 further comprising a multi-state quantizer located between the digital band-pass sigma-delta modulator and the switched mode power amplifier and a combiner located between the switched mode power amplifier and an antenna, wherein the multi-state quantizer is arranged to model a switched mode power amplifier and combiner transfer function, to provide an increased level of quantization.

9. The communication unit of claim 8 wherein the multi-state quantizer employs a non-uniform step-size.

10. The communication unit of claim 1 wherein the at least one delay comprises at least one unity gain delay.

11. The communication unit of claim 1 wherein the ratio of a sampling frequency employed by the digital band-pass sigma-delta modulator to a radio frequency (RF) output from the power digital to analog converter is fixed and the frequency is tuned, or the frequency is fixed and the ratio is adjusted.

12. The communication unit of claim 1 wherein the digital band-pass sigma-delta modulator is a fourth order band-pass sigma-delta architecture.

13. The digital band-pass sigma-delta modulator of claim 12, wherein at least one first pair of gain coefficients, c+d, and a second pair of gain coefficients, 2+cd, form the fourth order digital band-pass sigma-delta modulator, wherein the coefficient 'c' is defined by:

$$c = 2\cos\left(2\pi\frac{f_{notch} + \Delta}{f_{sd}}\right)$$

and the coefficient 'd' is defined by:

$$d = 2\cos\left(2\pi\frac{f_{notch} - \Delta}{f_{sd}}\right).$$

14. The communication unit of claim 13, wherein coefficient 'c' simplifies to: $1-\Delta$ and coefficient 'd' simplifies to: $1+\Delta$, whereby the first pair of gain coefficients, c+d, simplify to: $-2-2\Delta$ and the second pair of gain coefficients, 2+cd, simplify to: $2+(1-\Delta^2)$.

15. The communication unit of claim 13, wherein coefficient 'c' simplifies to: $-\Delta$ and coefficient 'd' simplifies to: $\Delta$, whereby the first pair of gain coefficients, c+d, simplify to: zero and the second pair of gain coefficients, 2+cd, simplify to: $-\Delta^2$.

16. A digital band-pass sigma-delta modulator for coupling to a a switched mode power amplifier in a power digital to analog converter, digital band-pass sigma-delta modulator comprising:
an input to receive an input baseband signal;
at least one delay;
at least two feedback branches;
at least one adder module arranged to add at least one feedback signal with an output from the at least one delay; and
a frequency control input for coupling to a phase locked loop and arranged to receive a digitally oversampled version of the input baseband signal, such that a ratio of a sampling frequency employed by the digital band-pass sigma-delta modulator to a radio frequency (RF) output from the power digital to analog converter is substantially fixed such that the at least one first feedback branch is formed using one from a group of: a zero gain, an additive inverse of a second feedback branch.

17. A method of modulating a signal in a communication unit comprising a switched mode amplifier and a digital band-pass sigma-delta modulator comprising at least two feedback branches coupled to the switched mode power amplifier in a power digital to analog converter, the method at the digital band-pass sigma-delta modulator comprising:
receiving an input baseband signal;
receiving a digitally oversampled version of the input baseband signal, such that a ratio of a sampling frequency employed by the digital band-pass sigma-delta modulator to a radio frequency (RF) output from the power digital to analog converter is fixed and the sampling frequency tuned or wherein the sampling frequency is fixed and the ratio is adjusted; and
feeding back an output from the digital band-pass sigma-delta modulator, via a first feedback branch, via one from a group of: a zero gain, an additive inverse of a first additive gain in a second feedback branch.

\* \* \* \* \*